United States Patent
Ni et al.

(10) Patent No.: US 11,252,843 B2
(45) Date of Patent: Feb. 15, 2022

(54) ADJUSTABLE AIR BAFFLE FOR SYSTEM AIRFLOW IMPROVEMENT

(71) Applicant: Quanta Computer Inc., Taoyuan (TW)

(72) Inventors: Hsiao-Tsu Ni, Taoyuan (TW); Chun Chang, Taoyuan (TW); Hsin-Chieh Lin, Taoyuan (TW); Chia-Jung Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 115 days.

(21) Appl. No.: 16/876,342

(22) Filed: May 18, 2020

(65) Prior Publication Data

US 2021/0274684 A1   Sep. 2, 2021

Related U.S. Application Data

(60) Provisional application No. 62/982,566, filed on Feb. 27, 2020.

(51) Int. Cl.
*H05K 7/20* (2006.01)
*F28F 13/06* (2006.01)

(52) U.S. Cl.
CPC ......... *H05K 7/20727* (2013.01); *F28F 13/06* (2013.01); *H05K 7/20145* (2013.01)

(58) Field of Classification Search
CPC ...... G06F 1/20; G06F 1/185; G06F 2200/201; H05K 7/20727; H05K 7/20736; H05K 7/20145; H05K 7/20181; H05K 7/20272; H01L 23/467; H01L 23/46; F28F 13/06

USPC ......... 361/695, 679.31, 679.48, 690, 679.49, 361/692, 679.51, 679.5; 165/104.33, 165/80.2; 454/325, 314, 358
See application file for complete search history.

(56) References Cited

U.S. PATENT DOCUMENTS

| | | | |
|---|---|---|---|
| 2009/0034190 A1* | 2/2009 | Tsai | G06F 1/20 361/695 |
| 2012/0020013 A1* | 1/2012 | Li | G06F 1/20 361/679.47 |

* cited by examiner

*Primary Examiner* — Mandeep S Buttar
(74) *Attorney, Agent, or Firm* — Nixon Peabody LLP

(57) ABSTRACT

An air baffle for optimizing thermal performance of memory components provided in a chassis is disclosed. The air baffle has a body and one or more venting units provided on the body. The body is configured to be removably coupled to the chassis. The body covers the memory components when coupled to the chassis. The one or more venting units direct air flowing through the chassis. Each of the venting units includes vent openings and a corresponding number of adjustable venting plates. The vent openings are each aligned with the memory components when the body is coupled to the chassis. Each of the adjustable venting plates have an open position or a closed position. A respective venting plate of the adjustable venting plates in the open position allows airflow through a respective vent opening of the vent openings. The respective venting plate of the adjustable venting plates in the closed position blocks airflow through the respective vent opening of the vent openings.

20 Claims, 8 Drawing Sheets

ADJUSTABLE AIR BAFFLE FOR SYSTEM AIRFLOW IMPROVEMENT

CROSS-REFERENCE TO RELATED APPLICATIONS

This patent application claims the benefit of U.S. Provisional Patent Application No. 62/982,566, filed Feb. 27, 2020. The contents of that application in its entirety are hereby incorporated by reference.

TECHNICAL FIELD

The present disclosure relates generally to systems and methods for optimizing thermal performance in computing devices. More particularly, aspects of this disclosure relate to a design of air baffles for improved thermal performance of memory modules.

BACKGROUND

Computing systems (e.g., desktop computers, blade servers, rack-mount servers, etc.) are employed in large numbers in various applications. High demand applications, such as network based systems, data centers, or high density finite element simulations can cause excess heat to be generated by the hardware of the computing systems. For example, a hard-drive of a server, memory modules installed in the server, and processors of the server, etc., operating at high capacity can generate excess heat. Heat generated by computing systems is generally dissipated to avoid damage or performance degradation of such components in the computing systems. For example, excessive heat can melt interconnects of fragile electronics or can damage substrates of these electronics.

Excessive heat can also reduce a rated lifetime of a hardware component of a computing system. For example, memory modules frequently store charge on capacitors and refresh these capacitors at time intervals. Excessive heat can reduce an amount of charge that these capacitors can store and can further increase a leakage rate of these capacitors, thereby shortening the time intervals for refresh. Memory modules are ubiquitous in computing systems, and as such, thermal management for effective dissipation of heat around memory modules is important. In addition, excessive heat may cause processors to reduce speed or even shut down, thereby impeding computer system operation. Thus, the present disclosure is directed at addressing problems associated with thermal management in computing systems.

SUMMARY

Some implementations of the present disclosure provide an air baffle for optimizing thermal performance of memory components provided in a chassis. The air baffle includes a body and one or more venting units provided on the body for directing air flowing through the chassis. The body is configured to be removably coupled to the chassis. The body covers the memory components when coupled to the chassis. Each of the venting units includes a plurality of vent openings and a plurality of adjustable venting plates. Each of the plurality of adjustable venting plates has an open position or a closed position. A respective venting plate of the adjustable venting plates in the open position allows airflow through a respective vent opening of the vent openings, and the respective venting plate of the adjustable venting plates in the closed position blocks airflow through the respective vent opening of the vent openings.

In an embodiment, the memory components include dual inline memory modules (DIMMs). A width of the respective venting plate is about a width of a DIMM slot on a printed circuit board installed in the chassis. In an embodiment, a first venting unit of the one or more venting units is proximate to a set of DIMM slots, and configured to modulate airflow to the set of DIMM slots. In an embodiment, a number of venting plates of the first venting unit configured in the open position is equal to a number of DIMMs installed in the set of DIMM slots. In an embodiment, a respective one of the venting plates of the first venting unit configured in the open position allows airflow to a respective one of the DIMMs installed in the set of DIMM slots. In an embodiment, a respective one of the venting plates of the first venting unit in the closed position blocks airflow to a respective empty DIMM slot in the set of DIMM slots. In an embodiment, each of the one or more venting units further includes three outside edges that are not in contact with the body.

In an embodiment, each of the venting units further includes an axle. The respective venting plate transitions from the open position to the closed position, or from the closed position to the open position, by pivoting about the axle. In an embodiment, the respective venting plate includes two long edges and two short edges, and the respective venting plate pivots on one of the two short edges. In an embodiment, the respective venting plate includes two long edges and two short edges, and the respective venting plate pivots on one of the two long edges. In an embodiment, the body comprises vertical and horizontal panels. The respective venting plate is substantially orthogonal to the horizontal panels of the body in the closed position, and substantially parallel to the horizontal panels of the body in the open position. In an embodiment, the respective venting plate pivots about the axle in only one direction when in the closed position, and in a direction opposite to the one direction when in the open position. In an embodiment, the body is configured to stop the respective venting plate from timber pivoting in one direction when the respective venting plate is in the open position. In an embodiment, in the closed position, the respective venting plate is prevented from pivoting in one direction by a venting unit in which the respective venting plate resides.

Some implementations of the present disclosure provide a system including a chassis, a printed circuit board installed on the chassis, and an air baffle. The printed circuit board includes one or more dual inline memory module (DIMM) slots. The air baffle includes a body configured to be removably coupled to the chassis. The body covers the one or more DIMM slots when coupled to the chassis. The air baffle also includes one or more venting units provided on the body of the air baffle for directing air flowing through the chassis. Each of the venting units includes a plurality of vent openings and a plurality of adjustable venting plates. Each of the plurality of adjustable venting plates is configured to be in an open position or a closed position. A respective venting plate of the adjustable venting plates configured in the open position allows airflow through a respective vent opening of the vent openings, and the respective venting plate of the adjustable venting plates configured in the closed position blocks airflow through the respective vent opening of the vent openings.

In an embodiment, a width of the respective venting plate is about a width of one of the one or more DIMM slots. In an embodiment, a first venting unit of the one or more venting units is proximate to a set of DIMM slots of the one or more DIMM slots, and configured to modulate airflow to the set of DIMM slots. In an embodiment, a number of venting plates of the first venting unit configured in the open position is equal to a number of DIMMs installed in the set of DIMM slots. In an embodiment, a respective one of the venting plates of the first venting unit configured in the open position allows airflow to a respective one of the DIMMs installed in the set of DIMM slots. In an embodiment, a respective one of the venting plates of the first venting unit configured in the closed position blocks airflow to a respective empty DIMM slot in the set of DIMM slots.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1:
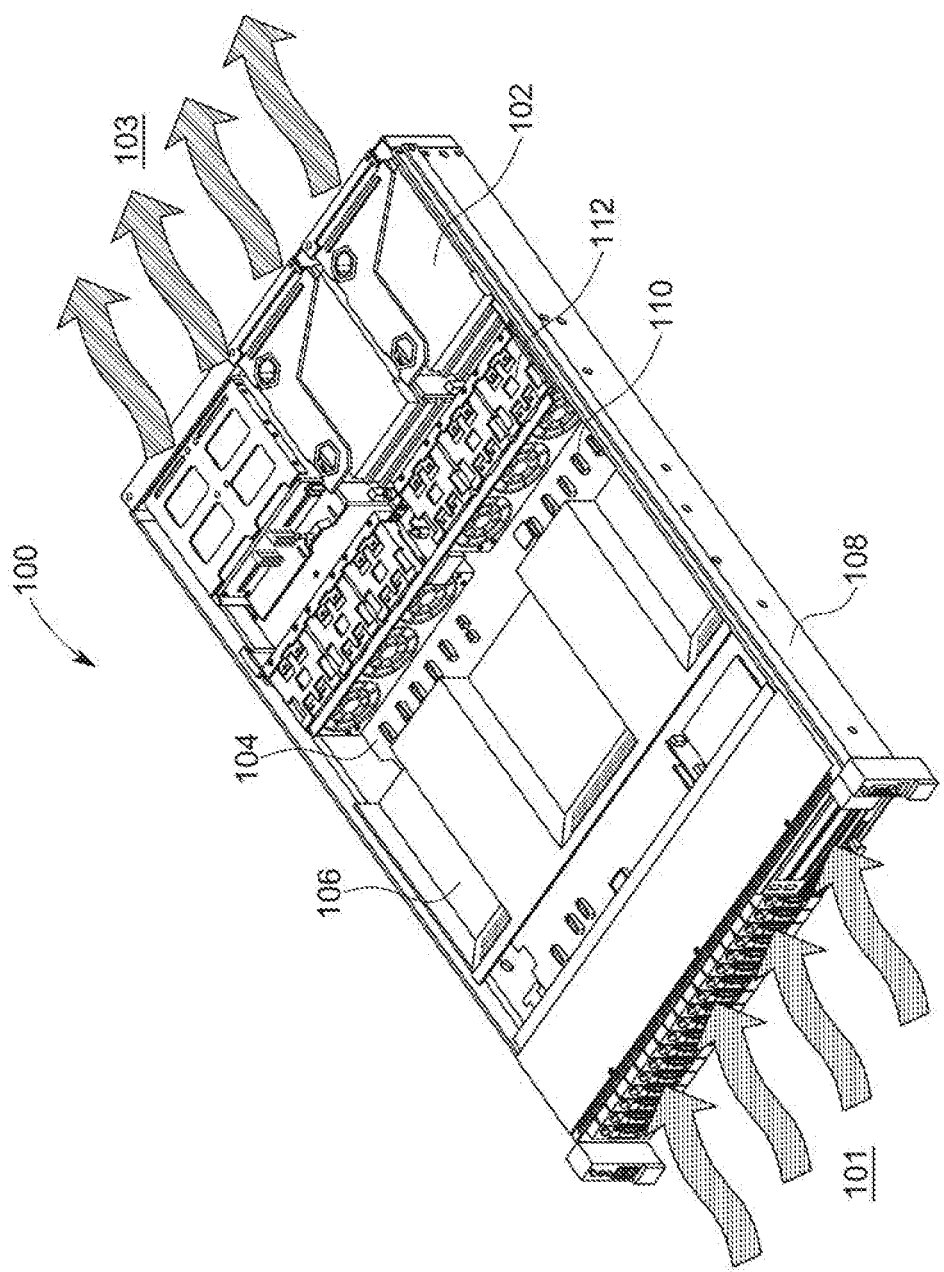
FIG. 1 illustrates a perspective view of a system with an air baffle.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives filling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Thermal management is an important aspect of optimizing a computing system's performance. Thermal management can be performed at component level, for example, at the level of computing system components that can heat up. Central processing units (CPUs), graphics processing units (GPUs), and dual in-line memory modules (DIMMs) are example of components usually considered when performing component level thermal management. A solution for thermal management at the component level involves using an air baffle to guide cool air to cool down these components.

There can be drawbacks associated with using an air baffle for thermal management in areas of a computing system that contain DIMMs. DIMMs are usually inserted DIMM slots provided on a motherboard or a printed circuit board (PCB) of a computing system. The DIMM slots are typically positioned in proximity to each other, with a short gap separating any two DIMM slots. In some implementations, DIMM slots are provided in sets of two, four, eight, sixteen, etc. A computing system need not have all DIMM slots filled with DIMMs to function properly, and as such, some users may only need a computing system that has only one DIMM even though the computing system has space for four DIMMs.

Since a number of DIMM slots provided on a computing system and/or a number of DIMM slots actually used in the computing system can vary based on individual needs, obtaining an optimized thermal management solution using an air baffle is elusive. Air baffles are typically designed to provide an optimized thermal solution when all DIMM slots of a computing system include a DIMM. When only some of the DIMM slots are filled with DIMMs, then the air baffle allows a bypass airflow that does not aid in dissipating heat around the installed DIMMs. The bypass airflow reduces effectiveness of the air baffle as a thermal management solution for the entire system. Conventional methods of dealing with the reduced effectiveness includes inserting dummy DIMMs in the empty DIMM slots. However, inserting dummy DIMMs adds additional manufacturing, and component costs to a computing system. Furthermore, requiring dummy DIMMs can be an inconvenience when the computing system is upgraded to higher capacity DIMMs that use a lower number of DIMM slots, but the user does not have any dummy DIMMs available to install in the newly empty slots.

With the drawbacks associated with dummy DIMMs, embodiments of the present disclosure provide air baffles with adjustable vents for mitigating thermal efficiency losses due to bypass airflow associated with empty DIMM slots in a computing system. Embodiments of the present disclosure further provide systems and methods for configuring and reconfiguring the adjustable vents of the air baffles.

FIG. 1 illustrates a system 100 with an air baffle 106, according to some implementations of the present disclosure. Incoming air current 101 enters a front end of a chassis 108 of the system 100. The incoming air current 101 passes through components in the chassis 108 resulting in an outgoing air current 103 exiting a back end of the chassis 108. In some implementations, one or more fans 112 are coupled to an inside surface of the chassis 108. The one or more fans 112 are configured to set a direction for the incoming air current 101 and the outgoing air current 103, such that both the incoming air current 101 and the outgoing air current 103 move in a same direction.

The system 100 can further include one or more components 102 in the chassis 108. These can include power supplies, processors, network interface cards, memory devices and the like. The system 100 can further include a printed circuit board (PCB) 104 with one or more PCB components. In some implementations, the PCB 104 is a computer motherboard. The air baffle 106 is configured to modulate the air current flowing through the chassis 108 and configured to cover one or more PCB components on the PCB 104. The air baffle 106 modulates the air current flowing through the chassis 108 by blocking or obstructing the air current and/or directing or redirecting the air current. Some of the one or more PCB components (e.g., components 110) are not covered by the air baffle 106.

Figure 2:
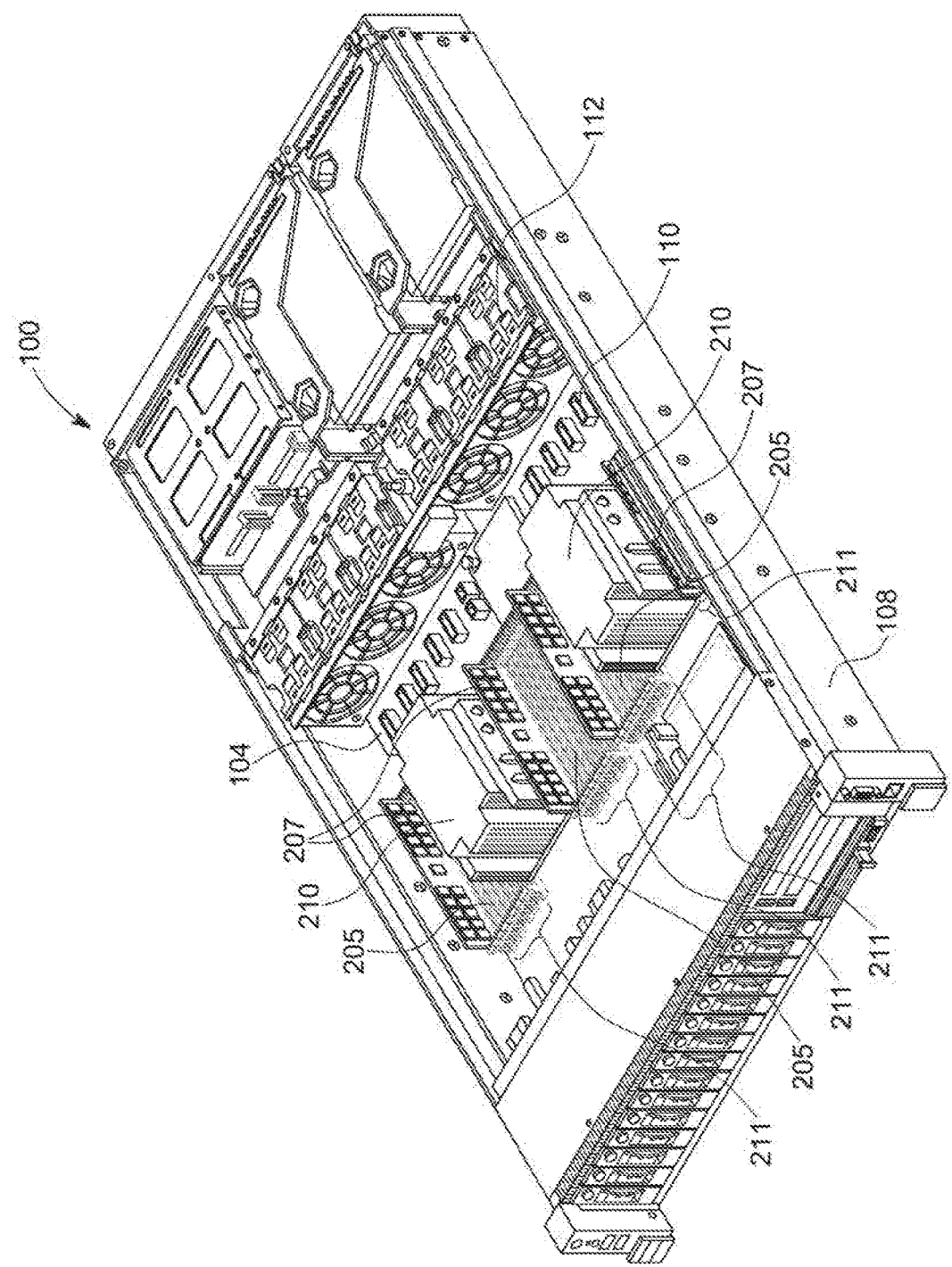
FIG. 2 illustrates a perspective view of the system of FIG. 1 with the air baffle removed.

FIG. 2 illustrates an example arrangement of PCB components under the air baffle 106 of the system 100 of FIG. 1. Some PCB components that can be covered by the air baffle 106 include a component 210, one or more DIMM slots 205, and one or more DIMMs 207. The component 210 in this example is a processor, such as CPU, GPU and a heat sink on the processor. Each of the DIMM slots 205 is configured to receive a DIMM that is in general proximity to a processor for access to the DIMM. The one or more DIMM slots 205 can be arranged in sections or DIMM sets 211 on the PCB 104. A number of DIMM slots 205 in a DIMM set 211 can vary. For example, two, four, eight, sixteen, etc., DIMM slots 205 can be provided in a DIMM set 211. The DIMM sets 211 in FIG. 2 are shown to include empty slots (e.g., the DIMM slots 205) and filled slots (e.g., DIMM slots that have received the one or more DIMMs 207).

Figure 3:
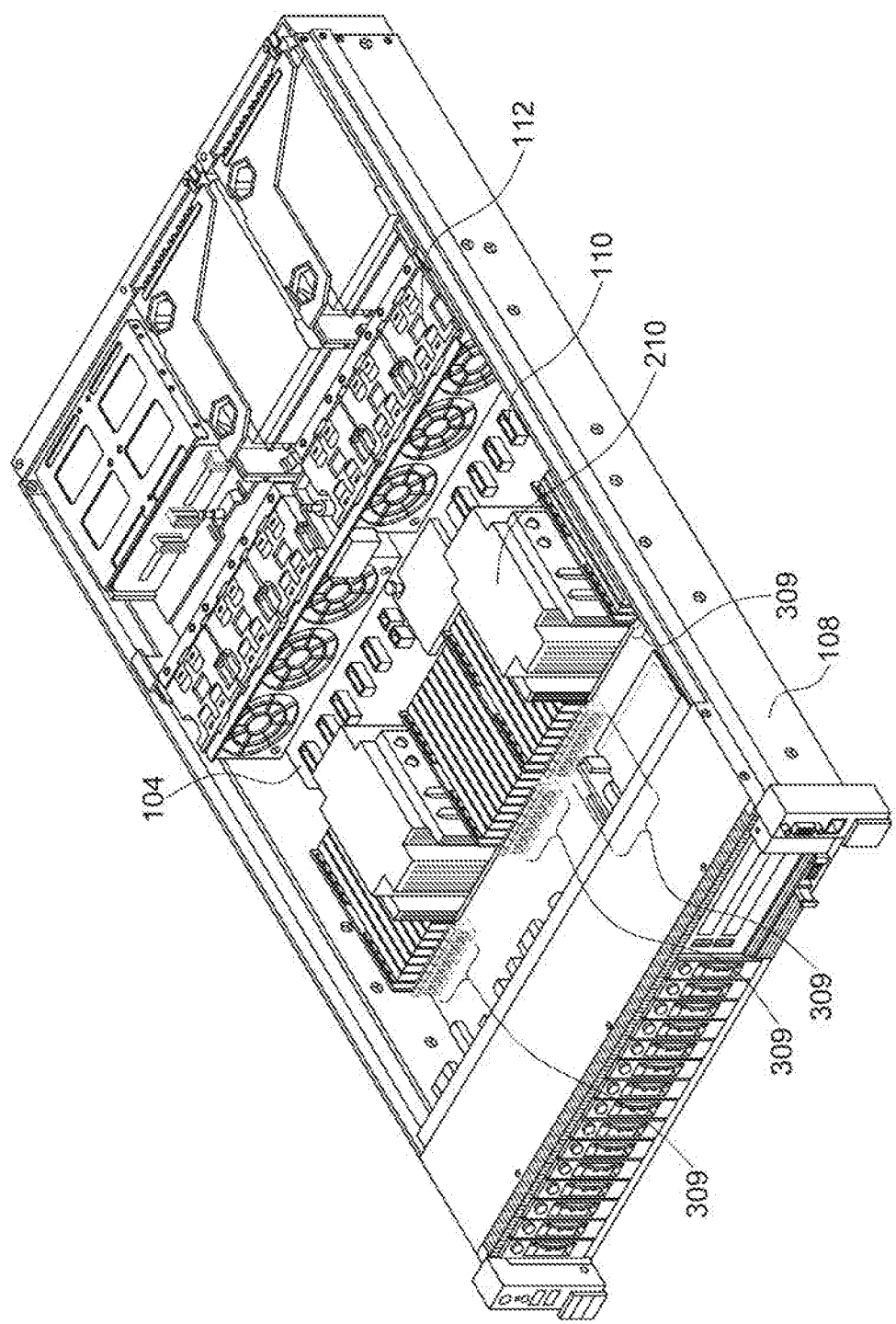
FIG. 3 illustrates a perspective view of the system of FIG. 1 with dual inline memory modules (DIMMs) filling all DIMM slots of the system of FIG. 1.

FIG. 3 illustrates the example arrangement of PCB components in FIG. 2 with one or more full DIMM sets 309. The full DIMM sets 309 have no open DIMM slots (see the DIMM set 211 with the one or more open DIMM slots 205), as compared with the corresponding DIMM slots 205 shown in FIG. 2 that only have one DIMM 207 installed.

Figure 4B:
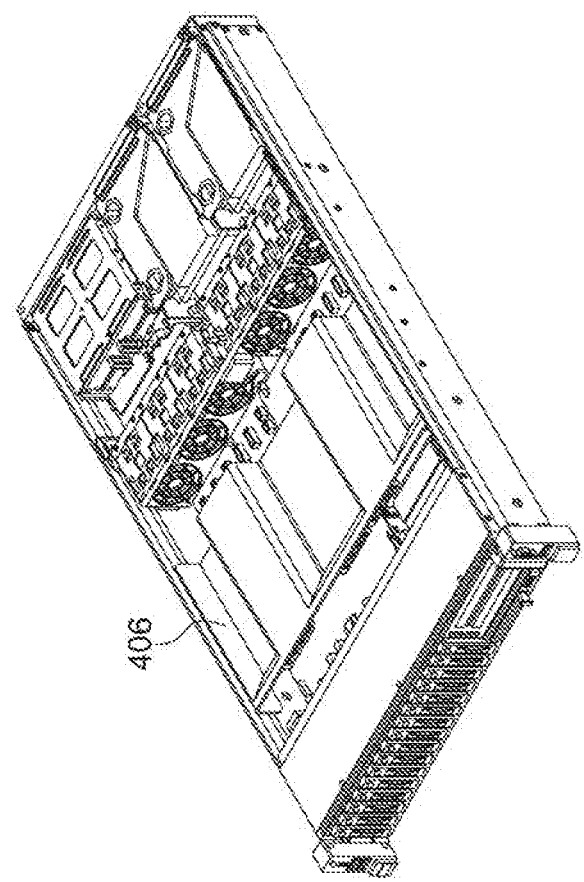
FIG. 4B illustrates a perspective view of the system of FIG. 4A with the known fixed air baffle vent design.
Figure 4A:
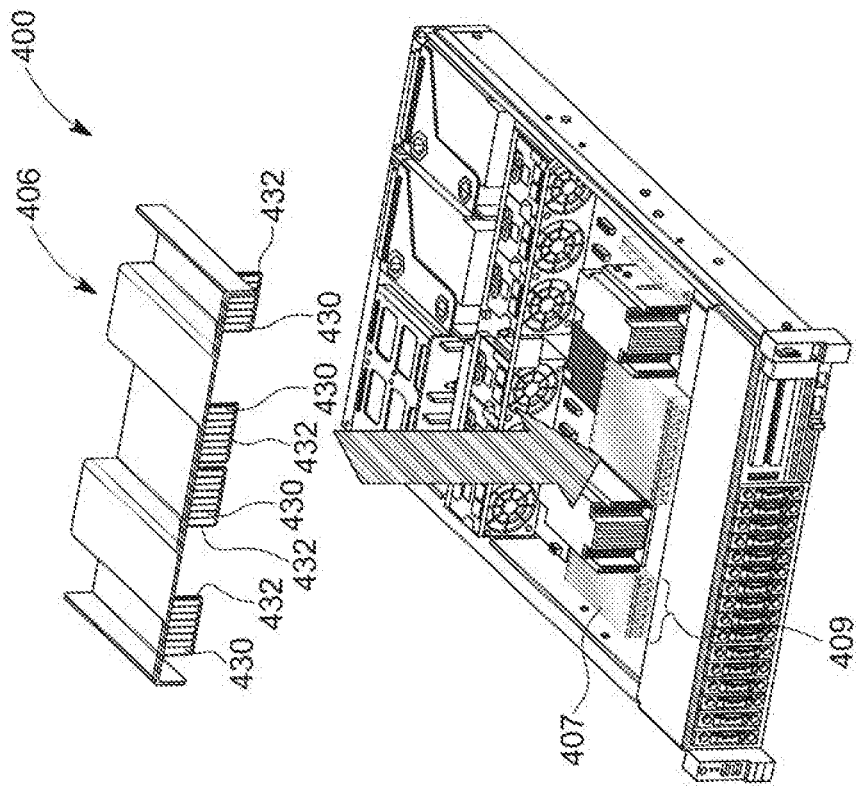
FIG. 4A illustrates a known fixed air baffle vent design on an air baffle being used in a system.

FIG. 4A illustrates a perspective view of a known fixed air baffle vent design for an air baffle 406 being used in a system 400. The system 400 is similar to or the same as die system 100 as illustrated in FIG. 3. The system 400 includes multiple full DIMM sets 409 with DIMMs 407. The system 400 includes the air baffle 406 with a fixed air baffle vent design. The air baffle 406 includes one or more venting units 432 with a plurality of vent openings 430. FIG. 4B illustrates a perspective view of the system 400 of FIG. 4A with the fixed air baffle vent design when the air baffle 406 is secured to cover the PCB components (e.g., the full DIMM sets 409) illustrated in FIG. 4A.

Fixed air baffle vent designs like the air baffle 406 of FIG. 4A have some drawbacks. A fixed air baffle vent design is optimized for a specific configuration or arrangement of PCB components. For example, in FIG. 4A, for optimized thermal management, the full DIMM sets 409 cannot have an empty DIMM slot. If any empty DIMM slots are present, the air baffle 406 is unable to provide an optimized thermal management solution because of bypass airflow through the empty slot or slots. As previously discussed, dummy DIMMs must be inserted in empty DIMM slots to mitigate the reduced effectiveness of the air baffle 406 due to bypass airflow.

Figure 5:
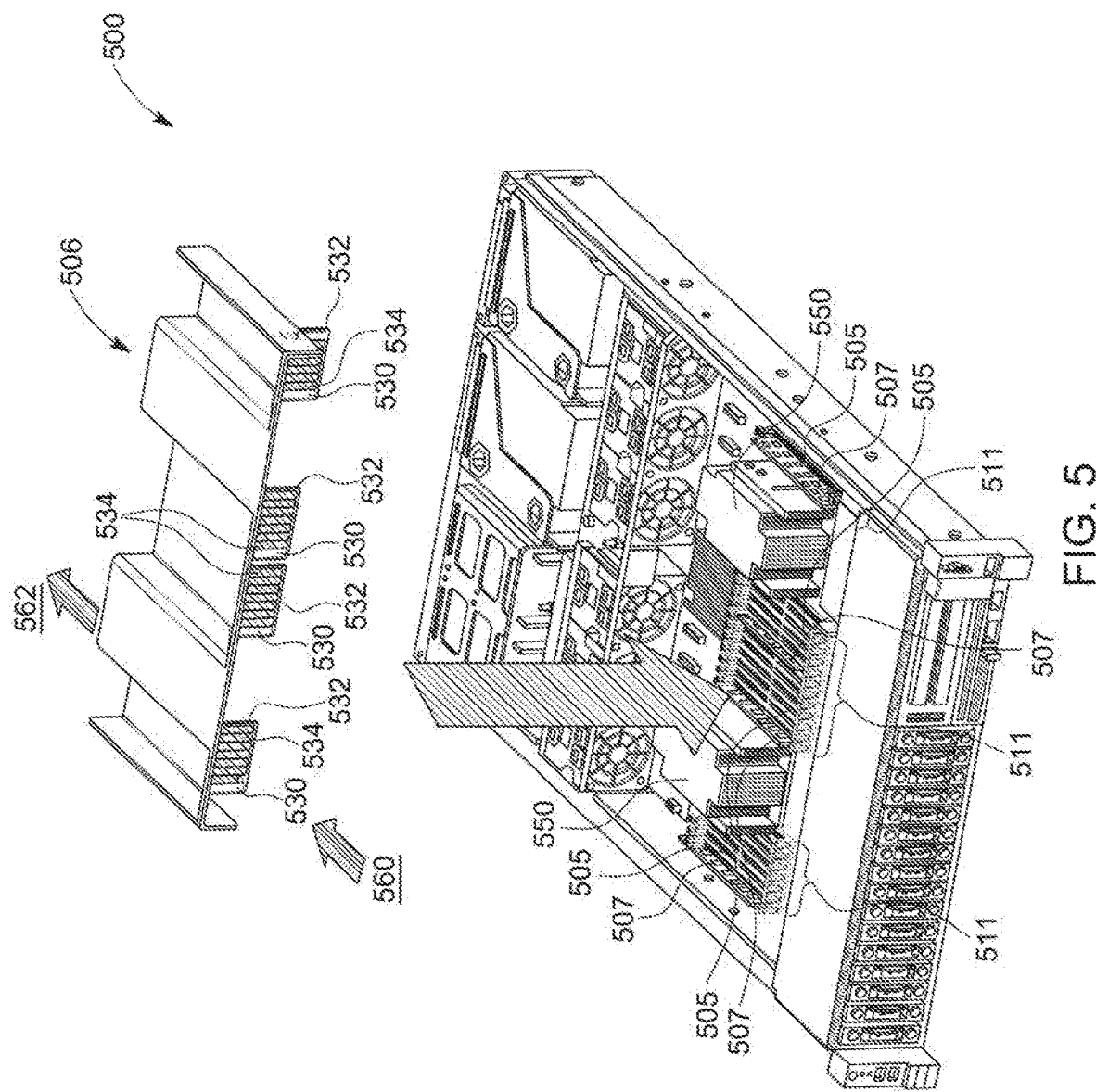
FIG. 5 illustrates an example adjustable air baffle vent design being used in a system, according to some implementations of the present disclosure.

FIG. 5 illustrates an adjustable air baffle vent design on an air baffle 506 being used in a system 500. The system 500 is similar to or the same as the system 100, as described above in connection with FIG. 1. The system 500 includes one or more DIMM sets 511. The DIMM sets 511 include DIMM slots with DIMMs 507 installed and DIMM slots 505 without any installed DIMMs. The air baffle 506 with the adjustable air baffle vent design includes a body configured to be removable from the chassis of the system 500. The air baffle 506 when installed, can cover the one or more DIMM sets 511. The air baffle 506 includes two air scoops that fit over two components 550. The components 550 are the same as or similar to the components 210 of FIG. 2. The air baffle 506 includes a front air intake end with airflow direction indicated by the arrow 560. The air baffle 506 includes a rear air outflow end with airflow direction indicated by the arrow 562.

The air baffle 506 includes one or more venting units 532. The venting units 532 are provided on the body of the air baffle 506. In some implementations, the venting units 532 extend from the body of the air baffle 506 such that the venting units 532 hang from the air baffle 506. The venting units 532 hang at the front air intake end of the air baffle 506 in locations corresponding to the DIMM sets 511. Each of the venting units 532 includes one or more vent openings 530 and one or more adjustable venting plates 534. The adjustable venting plates 534 are configured to be in an open position or in a closed position. As illustrated in FIG. 5, adjustable venting plates 534 are in a closed position. When in the closed position, the adjustable venting plates 534 prevent, obstruct, or block airflow through vent openings at the location of the adjustable venting plates 534. That is, each of the adjustable venting plates 534 in the closed position is blocking a vent opening. The vent openings 530 are visible because corresponding adjustable venting plates (not shown) are in the open position. When in the open position, the adjustable venting plates 534 allow airflow through the vent openings 530. The venting units 532 of the air baffle 506 can thus be configured to expose the vent openings 530 by placing the adjustable venting plates 534 in the open position or the closed position.

In some implementations, the adjustable venting plates 534 are placed in the open position exposing the openings 530 to allow airflow to the DIMM 507 under the air baffle 506. The adjustable venting plates 534 are placed in the closed position to block airflow to the empty DIMM slots 505. When configured as such, the vent openings 530 of the air baffle 506 can be arranged in specific locations to optimize thermal performance of the air baffle 506. In FIG. 5, four of the DIMMs 507 are installed in DIMM slots, and the air baffle 506 is configured to have the vent openings 530 at locations where the DIMMs 507 are located. Thus, the adjustable venting plates 534 are in an open position, not blocking the vent openings 530. In areas where there are empty DIMM slots, the air baffle 506 is configured such that the adjustable venting plates 534 are in closed positions. In some implementations, a number of the DIMMs 507 installed in the one or more DIMM sets 511 is equal to a number of the adjustable venting plates 534 placed in the open position. Thus, the number of vent openings 530 exposed is equal to the number of the DIMMs 507 installed in the one or more DIMM sets 511.

In some implementations, a width of each of the adjustable venting plates 534 is about a width of the DIMM slot 505. The width can be chosen to be in the range of 5 mm to 150 mm. In some implementations, the width is chosen to be about 6.5 mm. In some implementations, when the air baffle 506 is installed in the chassis, then the venting units 532 are positioned proximate to the one or more DIMM sets 511. In some implementations, when installed, a respective one of the venting units 532 is separated by about 2 mm from a respective one of the one or more DIMM sets 511. The proximity to the one or more DIMM sets 511 aid in better directing airflow to each of the DIMMs 507 in the one or more DIMM sets 511. Each of the vent openings 530 can allow airflow to a respective one of the DIMMs 507. Each of the adjustable venting plates 534 configured in the closed position blocks airflow to a respective one of the empty DIMM slots 505 in the one or more DIMM sets 511.

Figure 6:
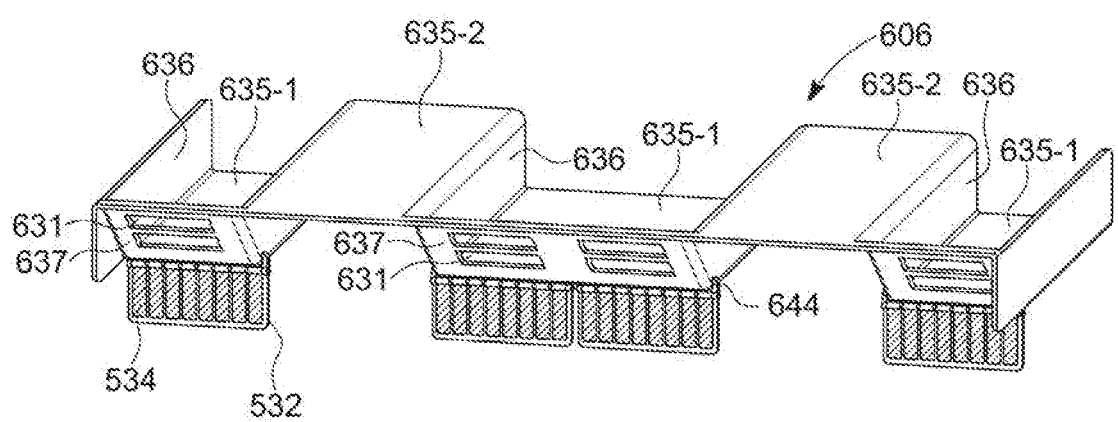
FIG. 6 illustrates an example adjustable air baffle, according to some implementations of the present disclosure.

FIG. 6 illustrates an air baffle 606 according to some implementations of the present disclosure. The air baffle 606 is the same as or similar to the air baffle 506 of FIG. 5. In FIG. 6, all of the adjustable venting plates 534 of the venting units 532 of the air baffle 506 are configured in the closed position. In comparison to the air baffle 506 of FIG. 5, no vent openings are exposed in the air baffle 506 of FIG. 6.

The body of the air baffle 606 can be made up of multiple panels or sections connected to one another. For example, multiple vertical panels 636 or 637 can be connected to multiple horizontal panels 635 to define a shape of the body of the air baffle 606. The horizontal panels 635 can be provided at different heights such that the air baffle 606 can conform to different PCB component heights. For example, referring to FIG. 2, the component 210 is taller than the DIMMs 207. As such, the air baffle 606 can have lower horizontal panels 635-1 at a relatively lower height at locations covering the DIMMs 207 when compared to a height of upper horizontal panels 635-2 at locations covering the component 210.

In some implementations, the air baffle 606 includes the multiple vertical panels 637 with panel openings 631. The panel openings 631 can facilitate airflow through the air baffle 606 to provide a path for airflow above a top surface of the multiple lower horizontal panels 635-1.

Figure 7:
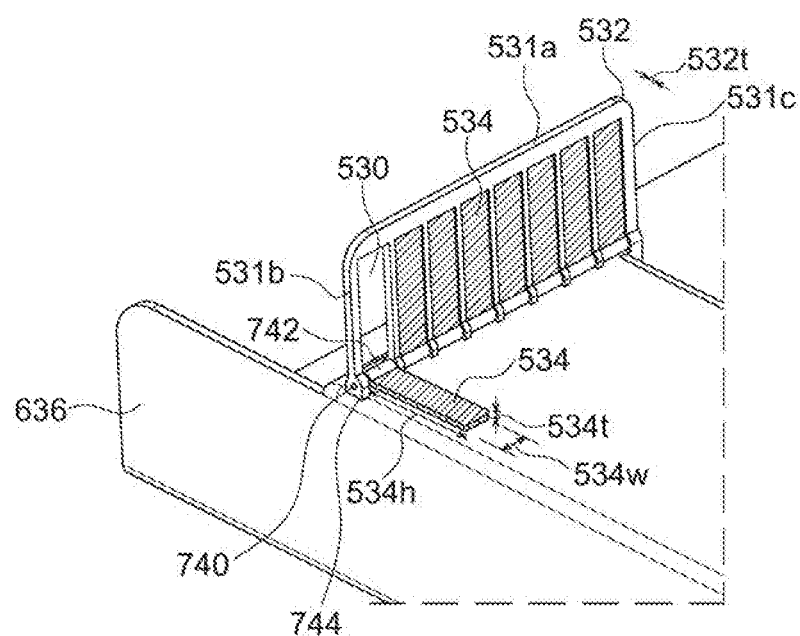
FIG. 7 illustrates an open position of an example adjustable venting plate, according to some implementations of the present disclosure.

FIG. 7 illustrates a zoomed in perspective view of the example venting unit 532 of the air baffle 606 of FIG. 6 with one of the adjustable venting plates 534 configured in the open position to expose the vent opening 530. In some implementations, the venting unit 532 hangs such that three outside edges 531a, 531b, and 531c of the venting unit 532 are not in contact with the body of the air baffle 606. In FIG. 7, the venting unit 532 is shown as a separate part that couples to and contacts a horizontal panel of the air baffle 606 at location 744. In FIG. 6, an additional contact of the venting unit 532 is provided at location 644. The venting unit 532 has a thickness 532t. Although shown as a separate part, in some implementations, the venting unit 532 can be engineered as a continuous part of the body of the air baffle 606 such that the venting unit 532 is merely an extension of the body of the air baffle 606.

The venting unit 532 of FIG. 7 includes a horizontal axle 740. Each of the adjustable veining plates 534 is configured to transition from the open position to the closed position, or from the closed position to the open position, by being pivoted around the horizontal axle 740. A respective one of the adjustable venting plates 734 attaches to the horizontal axle 740 via a respective bearing 742. The bearing 742 promotes pivoting the respective one of the adjustable venting plates 534 to facilitate transitioning the adjustable venting plate 534 from the closed position to the open position and vice versa. Each of the adjustable venting plates 534 can have a substantially rectangular cross sectional area with two long edges of height 534h and two short edges of width 534w. The height 534h can be within the range of about 22 mm to 30 mm. In some implementations, the height 534h is about 26.7 mm. The adjustable venting plates 534 can have a thickness 534t. The bearing 742 can be provided on one of the short edges of the adjustable venting plates 534.

In the open position, the adjustable venting plates 534 are substantially parallel to the horizontal panels (the lower horizontal panels 635-1 and the upper horizontal panels 635-2). When pivoting to transition from the closed position to the open position, the lower horizontal panels 635-1 prevent the adjustable venting plates 534 from further pivoting when the open position is reached. In some implementations, a stopper or a lock is provided to hold the adjustable venting plates 534 in the open position when the open position is reached. In some implementations, an adhesive or a temporary sticky strap (e.g., a Velcro® strap) is used to hold the adjustable venting plates 534 in the open position.

When pivoting to transition from the open position to the closed position, the inside edges of the venting unit 532 defining the vent openings 530 can be shaped such that the adjustable venting plates 534 have a snug fit with the respective bordering edges when the closed position is reached. The snug fit prevents the adjustable venting plates 534 from further pivoting in the same direction when the dosed position is reached. As such, an angle of pivot can be defined for the adjustable venting plates 534 between being substantially parallel with the lower horizontal panels 635-1 in the open position and being substantially orthogonal to the lower horizontal panels 635-1 in the closed position. Thus, after the desired DIMMs are installed in the DIMMs slot, an operator may dose the venting plates 534 corresponding to any empty DIMM slot and then install the air baffle 606 on the motherboard.

In some implementations, the bearing 742 includes damping such that when the adjustable venting plates 534 approach either extreme position (the closed position or the open position), the bearing 742 progressively restricts motion in the direction of approach.

Although depicted as the horizontal axle 740, other methods of transitioning the adjustable venting plates 534 between the open position and the closed position can be envisioned. For example, multiple vertical axles can be provided such that the adjustable venting plates 534 transition between the open position and the closed position via bearings along one of the long edges of the adjustable venting plates 534. The adjustable venting plates 534 can be made of plastic or metal material.

Figure 8A:
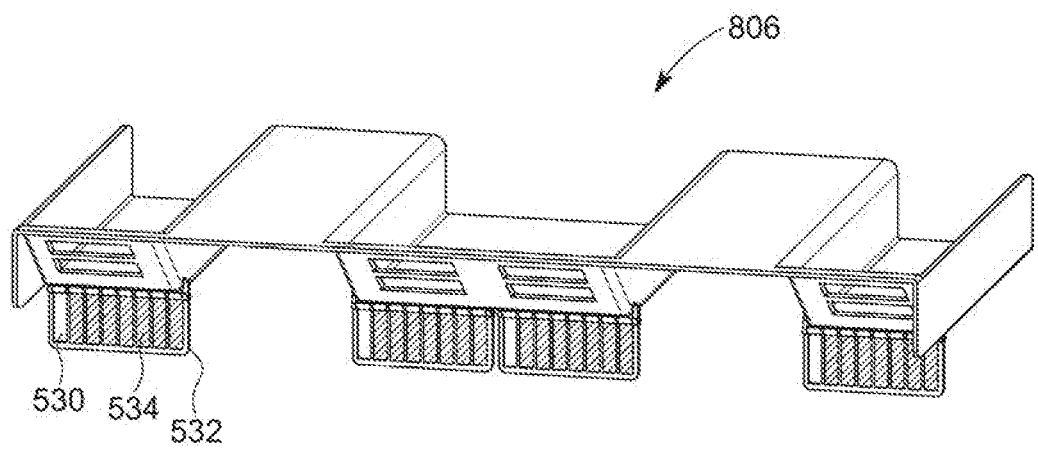
FIG. 8A illustrates a top perspective view of an example air baffle in a first configuration, according to some implementations.
Figure 8B:
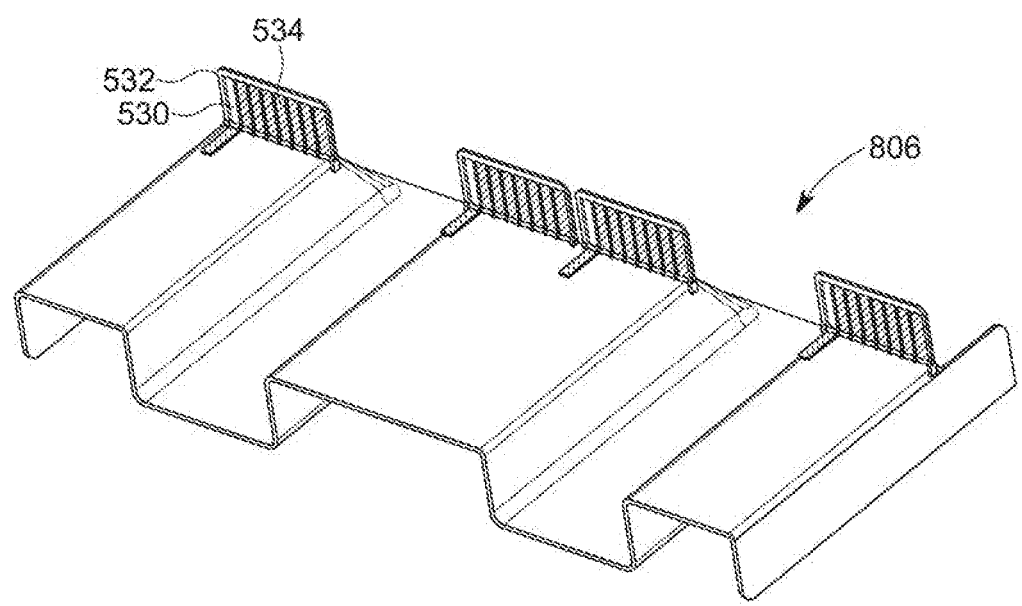
FIG. 8B illustrates a bottom perspective view of the air baffle of FIG. 8A.

Some example air baffle configurations are illustrated in the following figures. FIG. 8A illustrates a top perspective view of an air baffle 806 in a first configuration, according to some implementations of the present disclosure. FIG. 8B illustrates a bottom perspective view of the air baffle 806 of FIG. 8A. In this configuration, only one set of DIMMs is installed in each of the four groups of DIMM slots. Thus, most of the venting plates 534 in each of the four venting units are closed except for one vent opening 530 for each of the four venting units.

Figure 9A:
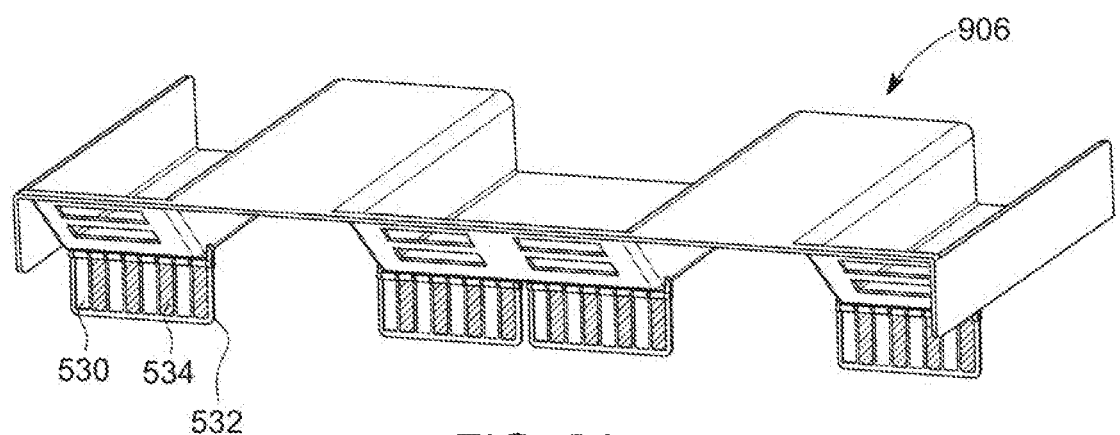
FIG. 9A illustrates a top perspective view of an example air baffle in a second configuration, according to some implementations.
Figure 9B:
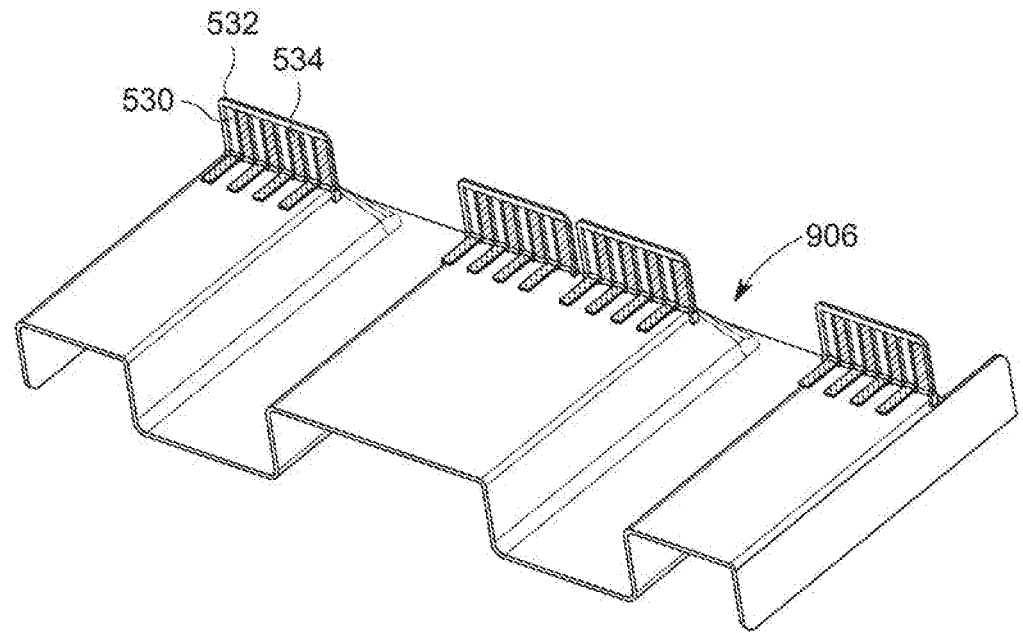
FIG. 9B illustrates a bottom perspective view of the air baffle of FIG. 9A.

FIG. 9A illustrates a top perspective view of an air baffle 906 in a second configuration, according to some implementations. FIG. 9B illustrates a bottom perspective view of the air baffle 906 of FIG. 9A. In the second configuration, a DIMM is installed in every other DIMM slot. Thus, every other venting plate 534 is in a closed position, leaving the venting openings 530 between such slots open to allow air flow to the occupied DIMM slots. As shown in FIGS. 8-9, the adjustable venting plates 534 being able to transition between the open position and the closed position enables the air baffles 806 and 906 to be arranged in different configurations.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. An air baffle for optimizing thermal performance of memory components provided in a chassis, comprising:
a body configured to be removably coupled to the chassis, the body covering the memory components when coupled to the chassis; and
one or more venting units provided on the body for directing air flowing through the chassis, each of the venting units including a plurality of vent openings and a plurality of adjustable venting plates, each of the plurality of adjustable venting plates having an open position or a closed position, wherein
a respective venting plate of the adjustable venting plates in the open position allows airflow through a respective vent opening of the vent openings, and
the respective venting plate of the adjustable venting plates in the closed position blocks airflow through the respective vent opening of the vent openings.

2. The air baffle of claim 1, wherein the memory components include dual inline memory modules (DIMMs), and a width of the respective venting plate is about a width of a DIMM slot on a printed circuit board installed in the chassis.

3. The air baffle of claim 1, wherein a first venting unit of the one or more venting units is proximate a set of dual inline memory module (DIMM) slots and configured to modulate airflow to the set of DIMM slots.

4. The air baffle of claim 3, wherein a number of venting plates of the first venting unit in the open position is equal to a number of DIMMs installed in the set of DIMM slots.

5. The air baffle of claim 4, wherein a respective one of the venting plates of the first venting unit configured in the open position allows airflow to a respective one of the DIMMs installed in the set of DIMM slots.

6. The air baffle of claim 4, Wherein a respective one of the venting plates of the first venting unit in the closed position blocks airflow to a respective empty DIMM slot in the set of DIMM slots.

7. The air baffle of claim 1, wherein each of the one or more venting units further includes three outside edges that are not in contact with the body.

8. The air baffle of claim 1, wherein each of the venting units further includes an axle, and the respective venting plate transitions from the open position to the closed position or from the closed position to the open position by pivoting about the axle.

9. The air baffle of claim 8, wherein the respective venting plate comprises two long edges and two short edges, and the respective venting plate pivots on one of the two short edges.

10. The air baffle of claim 8, wherein the respective venting plate comprises two long edges and two short edges, and the respective venting plate pivots on one of the two long edges.

11. The air baffle of claim 8, wherein the body comprises vertical and horizontal panels, and the respective venting plate is substantially orthogonal to the horizontal panels of the body in the dosed position and substantially parallel to the vertical panels of the body in the open position.

12. The air baffle of claim 8, wherein the respective venting plate pivots about the axle in only one direction when in the closed position and pivots in a direction opposite to the one direction when in the open position.

13. The air baffle of claim 8, wherein the body is configured to stop the respective venting plate from further pivoting in one direction when the respective venting plate is in the open position.

14. The air baffle of claim 8, wherein in the closed position, the respective venting plate is prevented from pivoting in one direction by a venting unit in which the respective venting plate resides.

15. A system comprising:
- a chassis;
- a printed circuit board installed on the chassis, the printed circuit board including one or more dual inline memory module (DIMM) slots; and
- an air baffle including:
  - a body configured to be removably coupled to the chassis, the body covering the one or more DIMM slots when coupled to the chassis; and
  - one or more venting units provided on the body of the air baffle for directing air flowing through the chassis, each of the venting units including a plurality of vent openings and a plurality of adjustable venting plates, each of the plurality of adjustable venting plates being configured to be in an open position or a closed position,
  - wherein a respective venting plate of the adjustable venting plates configured in the open position allows airflow through a respective vent opening of the vent openings, and the respective venting plate of the adjustable venting plates configured in the closed position blocks airflow through the respective vent opening of the vent openings.

16. The system of claim 15, wherein a width of the respective venting plate is about a width of one of the one or more DIMM slots.

17. The system of claim 15, wherein a first venting unit of the one or more venting units is proximate to a set of DIMM slots of the one or more DIMM slots and configured to modulate airflow to the set of DIMM Slots.

18. The system of claim 17, wherein a number of venting plates of the first venting unit configured in the open position is equal to a number of DIMM installed in the set of DIMM slots.

19. The system of claim 18, wherein a respective one of the venting plates of the first venting unit configured in the open position allows airflow to a respective one of the DIMMs installed in the set of DIMM slots.

20. The system of claim 19, wherein a respective one of the venting plates of the first venting unit configured in the closed position blocks airflow to a respective empty DIMM slot in the set of DIMM slots.

* * * * *